United States Patent
Chao et al.

(10) Patent No.: US 9,165,968 B2
(45) Date of Patent: Oct. 20, 2015

(54) 3D-STACKED BACKSIDE ILLUMINATED IMAGE SENSOR AND METHOD OF MAKING THE SAME

(75) Inventors: Calvin Yi-Ping Chao, Zhubei (TW); Kuo-Yu Chou, Hsinchu (TW); Fu-Lung Hsueh, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 330 days.

(21) Appl. No.: 13/616,850

(22) Filed: Sep. 14, 2012

(65) Prior Publication Data

US 2014/0077057 A1 Mar. 20, 2014

(51) Int. Cl.
*H01L 27/146* (2006.01)
*H04N 5/374* (2011.01)

(52) U.S. Cl.
CPC ...... *H01L 27/14634* (2013.01); *H01L 27/1464* (2013.01); *H01L 27/14636* (2013.01); *H01L 27/14641* (2013.01); *H04N 5/374* (2013.01)

(58) Field of Classification Search
USPC .............. 250/214.1, 214 R, 208.1, 214 DC; 257/431, 778, E31.084
See application file for complete search history.

(56) References Cited

U.S. PATENT DOCUMENTS

2010/0238334 A1* 9/2010 Takahashi .................. 348/305
2011/0049336 A1 3/2011 Matsunuma

OTHER PUBLICATIONS

Yeh, S.F. et al., "A New CMOS Image Sensor Readout Structure for 3D Integrated Imagers", 2011 IEEE Custom Integrated Circuits Conferenced (CICC), Sep. 2011, 4 pages.
Koyanagi, M. et al., "Three-Dimensional Integration Technology Using Through-Si Via Based on Reconfigured Wafer-to-Wafer Bonding", 2010 IEEE Custom Integrated Circuits Conference, Sep. 2010, 4 pages.
Coudrain, P. et al., "Towards a Three-Dimensional Back-Illuminated Minaturized CMOS Pixel Technology using 100nm Inter-Layer Contacts", in Proc. of 2009 International Image Sensor Workshop, Bergen, Norway, Jun. 22-28, 2009, 4 pages.
Deptuch, G.W. et al., "Vertically Integrated Circuits at Fermilab", IEEE Transactions on Nuclear Science, Aug. 2010, 57(4):2178-2186.

* cited by examiner

*Primary Examiner* — Francis M Legasse, Jr.
(74) *Attorney, Agent, or Firm* — Duane Morris LLP

(57) ABSTRACT

A stacked image sensor and method for making the same are provided. The stacked image sensor includes an upper chip with a pixel array thereon. The second chip includes a plurality of column circuits and row circuits associated with the columns and rows of the pixel array and disposed in respective column circuit and row circuit regions that are arranged in multiple groups. Inter-chip bonding pads are formed on each of the chips. The inter-chip bonding pads on the second chip are arranged linearly and are contained within the column circuit regions and row circuit regions in one embodiment. In other embodiments, the inter-chip bonding pads are staggered with respect to each other. In some embodiments, the rows and columns of the pixel array include multiple signal lines and the corresponding column circuit regions and row circuit regions also include multiple inter-chip bonding pads.

21 Claims, 10 Drawing Sheets

3D-STACKED BACKSIDE ILLUMINATED IMAGE SENSOR AND METHOD OF MAKING THE SAME

TECHNICAL FIELD

The disclosure relates, most generally, to a solid state imaging device, and more particularly to a three-dimensional CMOS image sensor and method for forming the same.

BACKGROUND

Solid state image sensors, such as charge-coupled devices (CCD) and CMOS (complementary metal oxide semiconductor) image sensors (CIS) are commonly used as input devices for electronic video and still cameras, robotic/machine vision and other imaging devices. These image sensors include a light sensing element, i.e. a photodiode, within an individual pixel. The pixels are arranged into two-dimensional rows and columns as pixel arrays. The light data captured by the plurality of the light sensing pixels arranged in the pixel array is processed using associated logic and analog circuits. The various circuits include column circuits associated with a column of pixels of the pixel array and row circuits associated with rows of pixels of the pixel arrays. The circuits perform various functions and each column of the pixel array has an associated column circuit and each row of the pixel array has an associated row circuit. In two-dimensional CMOS image sensors, the column circuits and row circuits surround the pixel array.

In today's rapidly advancing electronics industry, and especially in the electronics imaging industry, there is a continued push for increased miniaturization of the various components, including the chips upon which image sensors are formed. There is also a drive to produce image sensors with maximized imaging capabilities. An image sensor with minimal foot print is essential for the compact camera modules used in mobile devices like smart phones and tablet computers.

BRIEF DESCRIPTION OF THE DRAWING

The present disclosure is best understood from the following detailed description when read in conjunction with the accompanying drawing. It is emphasized that, according to common practice, various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
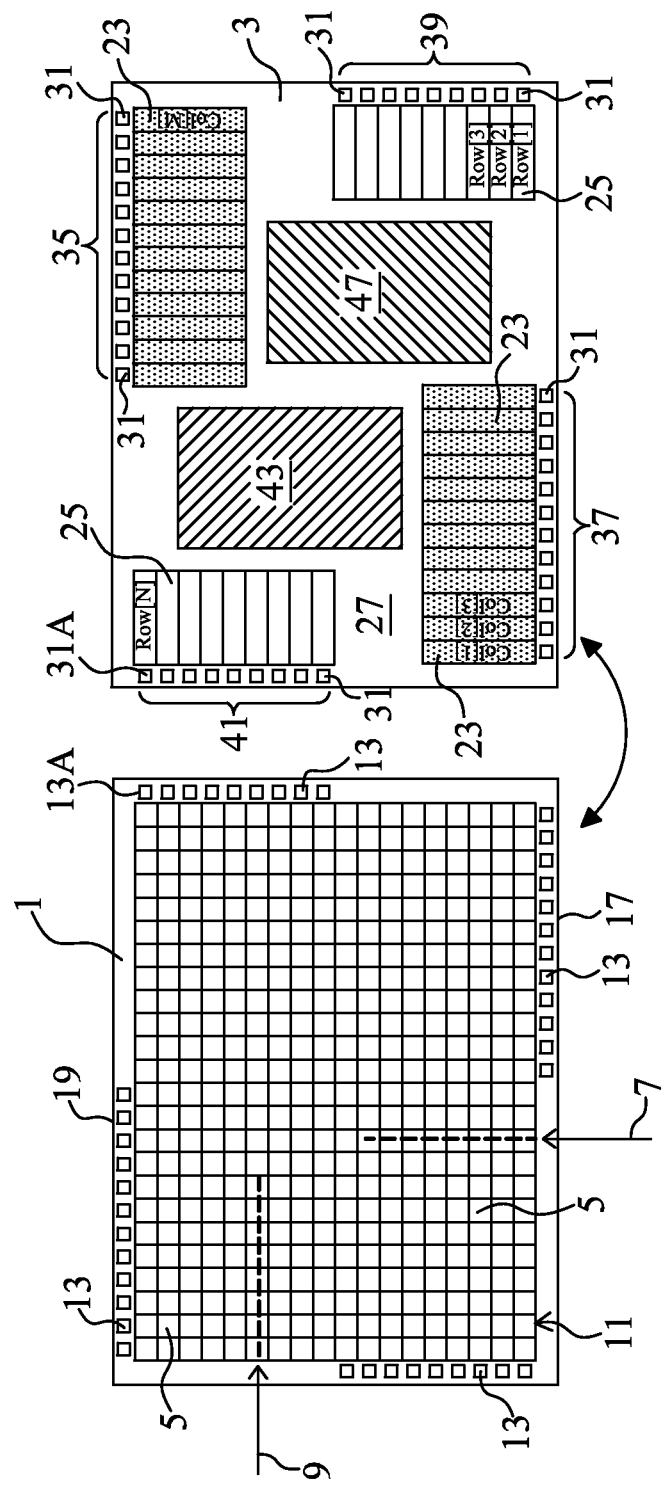
FIG. 1 is a plan view showing an arrangement of features of an embodiment of upper and lower chips of a 3D image sensor according to the disclosure.

The word "exemplary" as used herein, means "serving as an example or illustration." Any aspect or feature described herein as "exemplary" is not necessarily to be construed as preferred or advantageous over other aspects or features.

The disclosure provides a three-dimensional CMOS image sensor in which the footprint of the CMOS image sensor is minimized. The three-dimensional CMOS image sensor is formed of multiple chips and is formed of two separate chips in some embodiments. The chips are stacked over, and joined to, one another. In some embodiments, the chips are bonded in a chip-to-chip manner and, in other embodiments, the chips are bonded together when they are still part of a wafer, i.e. wafer-to-wafer bonding in which entire wafers are bonded together. In other embodiments, chip-to-wafer bonding is used whereby a chip is bonded to a corresponding chip formed on a wafer. Although none of the previously mentioned embodiments are preferred over one another, the following disclosure generally makes reference to the illustrations which depict chips and show chip-to-chip bonding in order to show detail, but it should be understood to apply to wafer-to-wafer bonding. It should be understood that the following description applies equally to any of the aforementioned embodiments, for example embodiments in which a plurality of chips are simultaneously bonded to one another when in wafer form.

In some embodiments, the two chips are bonded directly together by wafer-to-wafer bonding technologies. An array of pixels occupies substantially the entire upper chip which does not include associated column and row circuits. The column and row circuits are included on the lower chip and are pitch-matched to the pixel array in some embodiments. In some embodiments, the column and row circuits are formed of a dual-oxide CMOS process whereas the pixel array chip is formed using a single-oxide NMOS-only process. According to this embodiment in which the pixel array chip does not require the additional, costly processing operations associated with CMOS processing, it can be formed using a faster and less expensive sequence of NMOS processing operations. Conversely, according to this embodiment, the lower chip including the row and column circuits does not require the specially dedicated implantation operations required for the formation of pixels and is not subjected to undergoing such operations. An efficiency of processing is thereby achieved.

The upper chip includes the pixel array and the lower chip includes the support circuitry—the row circuits and column circuits associated with the rows and columns of the pixel array, each formed in an associated circuit area in some embodiments. In some embodiments the row circuit areas are rectangular and parallel to one another, and orthogonal with respect to the rectangular column circuit regions. The column circuit regions are all disposed adjacent one another in some embodiments and they are grouped into separate groups of column circuit regions in other embodiments. The same is true for row circuit regions. Each column and row circuit includes at least one contact that is joined to the associated column or row of the pixel array, through various conductive features such as, but not limited to, a stack of multiple vias and conductive leads formed of metal layers. The column and row circuits advantageously include multiple contacts joined to the associated column or row of the pixel array, in some embodiments in which the associated column or row of the pixel array includes multiple signal lines.

FIG. 1 is a plan view showing the device surfaces of two chips: upper chip 1 and lower chip 3. Upper chip 1 includes a plurality of pixels 5 arranged in an array including columns 7 and rows 9. Each pixel 5 includes a photodiode and various associated pixel transistors and includes other associated components in other embodiments. The pixels 5 include micro-lenses and color filters in various embodiments (see FIG. 10). Pixels 5 of column 7 and row 9 form pixel array 11. Inter-chip bonding pads 13 are disposed on the peripheral edges of the opposite surface of upper chip 1 and each inter-chip bonding pad 13 is associated with a row 9 or column 7. Each inter-chip bonding pad 13 is coupled to its associated row 9 or column 7 disposed on the opposite surface of upper chip 1, through various conductive interconnect features. In the illustrated embodiment, the inter-chip bonding pads 13 associated with columns 7 appear along both edges 17 and 19 of upper chip 1 but in other embodiments the inter-chip bonding pads 13 are grouped differently and in some embodiments all of the inter-chip bonding pads 13 associated with the columns appear on the same edge (17 or 19) of upper chip 1. The same is true for the inter-chip bonding pads 13 associated with rows 9 of pixel array 11. Pixel array 11 occupies substantially all of the area of upper chip 1 which does not include any support circuitry associated with the rows 9 and columns 7 of pixel array 11.

Lower chip 3 includes a plurality of column circuits and row circuits formed on device surface 27 of lower chip 3. It should be understood that the opposed (non-device) surfaces of the illustrated chips will be joined together, e.g. inter-chip bonding pad 31A of lower chip 3 will be joined to inter-chip bonding pad 13A of upper chip 1. Lower chip 3 includes row circuits each formed in a corresponding rectangular area identified as row circuit regions 25 and column circuits are each formed in a corresponding rectangular area identified as column circuit regions 23. In some embodiments, the row circuits are formed in rectangular row circuit regions 25 that are pitch-matched to the corresponding row 9 of upper chip 1 and the column circuits are formed in rectangular column circuit regions 23 that are pitch-matched to a corresponding column 7 of upper chip 1. For simplicity of description, column circuit regions 23 are alternatively referred to as column circuits 23 and row circuit regions 25 are alternatively referred to as row circuits 25. Each column circuit region 23 has a corresponding inter-chip bonding pad 31 and each row circuit region 25 includes a corresponding inter-chip bonding pad 31 formed on the opposed surface of lower chip 3. In the illustrated embodiment of FIG. 1, column circuits regions 23 are grouped into two groups: column circuit group 35 and column circuit group 37. Similarly, row circuits regions 25 are grouped into two groups: row circuit group 39 and row circuit group 41.

Each column circuit 23 associated with a corresponding column 7 of pixel array 11, carries out a dedicated electronic function associated with the column and in one embodiment each column circuit 23 is a data output collection circuit. In some embodiments, column circuit 23 includes a current source to drive a pixel source-follower or analog sample-and-hold circuits. In some embodiments, column circuit 23 includes analog switches and multiplexing circuits to output the analog pixel signal column-by-column to a global programmable amplifier and a global analog-to-digital converter (ADC). In some embodiments, the circuit 23 includes an amplifier for each column. In some embodiments, column circuit 23 includes a column-parallel ADC for each column. The column-parallel ADC may include a level-shifting circuit, an offset cancellation circuit, a comparator, a successive-approximating control circuit, a number of digital latches, storage elements, or digital up-and-down counters in various embodiments. Column circuits 23 perform other functions in other embodiments but are distinguished from row circuits 25. In some embodiments, row circuits 25 include row-address decoders, shift registers, row-control voltage level shifters, and slew-rate control circuits.

Additional circuitry is included in regions 43 and 47 of lower chip 3. The additional circuitry 43, 47 includes various control circuits, timing generators, and other peripheral circuits such as bias generators, reference generators that generate reference voltages, low-dropout regulators, global amplifiers and ADC's, control circuits that generate sensor timing-control signals, phase-locked loop clock generators and so forth, in various embodiments, and are coupled to various other components using connections that are not shown in FIG. 1.

In some embodiments, pixel array 11 is formed on a semiconductor substrate, upper chip 1, using a single oxide, NMOS-only processing sequence and does not require CMOS processing operations that utilize a dual oxide technology to accommodate operation at both lower and higher voltages. In some embodiments, lower chip 3 is formed on a semiconductor substrate using a dual-oxide CMOS processing technology sequence but is not exposed to various multiple high-energy implants used to form deep photodiodes in pixel array 11, or a variety of special process steps used to enhance the optical performance of photodiodes that otherwise are not needed for other non-pixel-array circuits. In this manner, each of upper chip 1 and lower chip 3 is formed using an economy of processing operations and does not undergo additional processing operations utilized only on a portion of the chip. This provides an advantage over two-dimensional image sensors in which both the pixel arrays and the support circuitry is formed on the same chip. In addition, a carrier wafer that is typically used to support the top-layer sensor wafer containing upper chip 1 in a thin-down process to shorten the optical path, is not needed anymore; instead the mechanical support is provided by the bottom-layer wafer containing lower chip 3, at the wafer stage.

Figure 2:
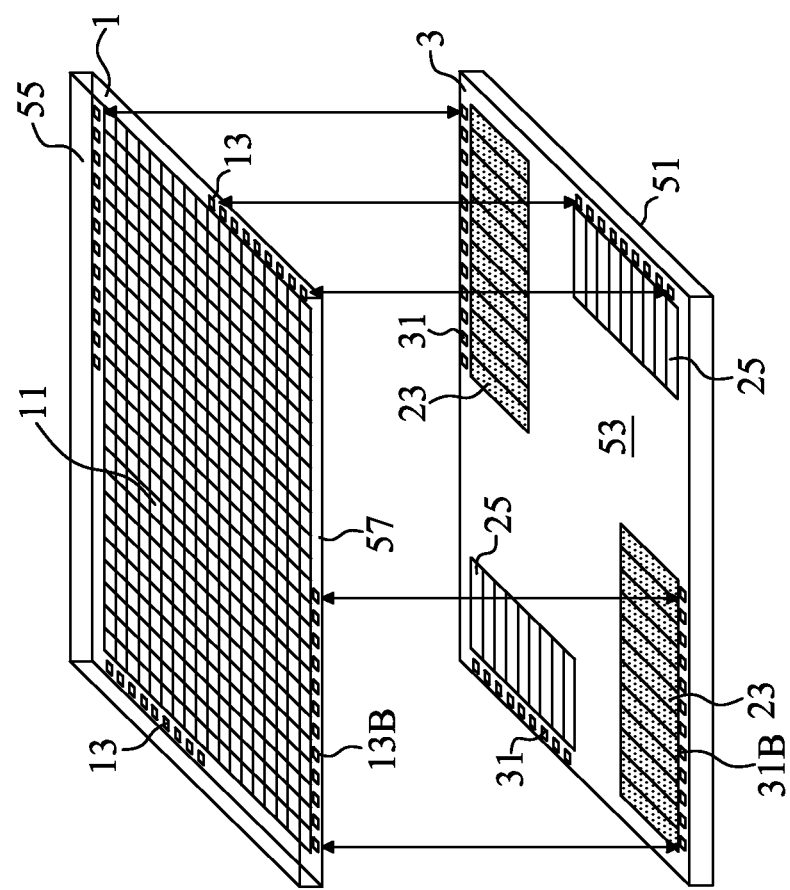
FIG. 2 is a plan view showing a method for bonding the two chips shown in the embodiment of FIG. 1.

FIG. 2 shows features of upper chip 1 and lower chip 3 and shows the two chips positioned over one another for mounting and bonding. It should be understood that the circuitry such as column circuits 23 and row circuits 25 of lower chip 3 is actually formed on bottom surface 51, not top surface 53, as bottom surface 51 corresponds to device surface 27 of lower chip 3 of FIG. 1. Inter-chip bonding pads 31 are formed on top surface 53 and extend through lower chip 3 to couple to column circuits 23 and row circuits 25 using conductive interconnect features such as a stack of vias and metal layers. Inter-chip bonding pad 31B of lower chip 3 is aligned with and will be joined to inter-chip bonding pad 13B of upper chip 1. Pixel array 11 is formed on a silicon device layer disposed on upper surface 55 of upper chip 1 and inter-chip bonding pads 13 are formed on lower surface 57 and also extend through upper chip 1 and are coupled to the rows and columns of pixel array 11. This will be shown in further detail in FIG. 10. Various bonding techniques are used in various embodiments to bond upper chip 1 to lower chip 3 and to provide electrical connection between the components thereon. Various suitable means for face-to-face wafer bonding are available and are used in various embodiments. Various materials such as adhesive organic films, and oxide and metal hybrid bonding structures, are used in various embodiments.

Figure 3:
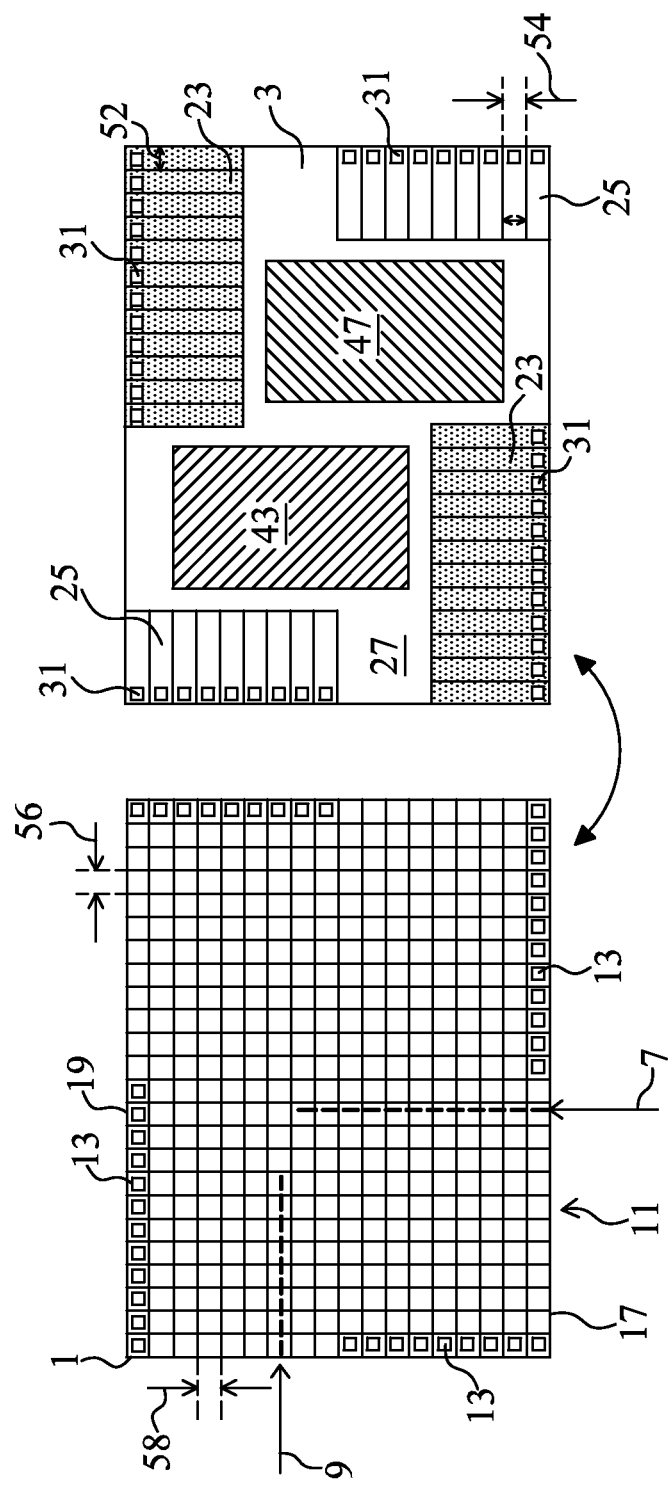
FIG. 3 is a plan view showing an arrangement of features of another embodiment of upper and lower chips of a 3D image sensor according to the disclosure.

FIG. 3 shows an arrangement of upper chip 1 and lower chip 3 in an arrangement similar to that of FIG. 1. In the embodiment of FIG. 3, however, inter-chip bonding pads 13 are disposed on the opposed surface of upper-chip 1 but within the region of pixel array 11, and not peripherally outside pixel array 11 as in the embodiment of FIG. 1. In the embodiment of FIG. 3, pixel array 11 occupies substantially all of the device surface of upper chip 1 and inter-chip bonding pads 13 are disposed on the opposed surface of upper chip 1. Lower chip 3 of FIG. 3 is also similar to lower chip 3 of FIG. 1 and includes two groups of column circuit regions 23 and two groups of row circuit regions 25. Each row circuit region 25 and column circuit region 23 includes inter-chip bonding pad 31 situated within the respective circuit region and disposed on the opposed back surface of lower chip 3, opposite device surface 27. In the embodiments illustrated in each of FIGS. 1 and 3, the inter-chip bonding pads 13, 31 are disposed completely within column circuit region 23 and row circuit region 25. Each inter-chip bonding pad 13 and 31 includes a width less than the corresponding width of the rectangularly shaped column circuit region 23 or row circuit region 25. For example, the dimension of inter-chip bonding pads 13, 31 are less than width 52 of column circuit region 23 and less than width 54 of row circuit region 25. Also in the illustrated embodiments of FIGS. 1 and 3, width 52 of column circuit region 23 is the same as width 56 of column 7 and width 54 of row circuit region 25 is the same as width 58 of the corresponding row 9 of pixel array 11, i.e. they are pitch-matched.

Figure 4:
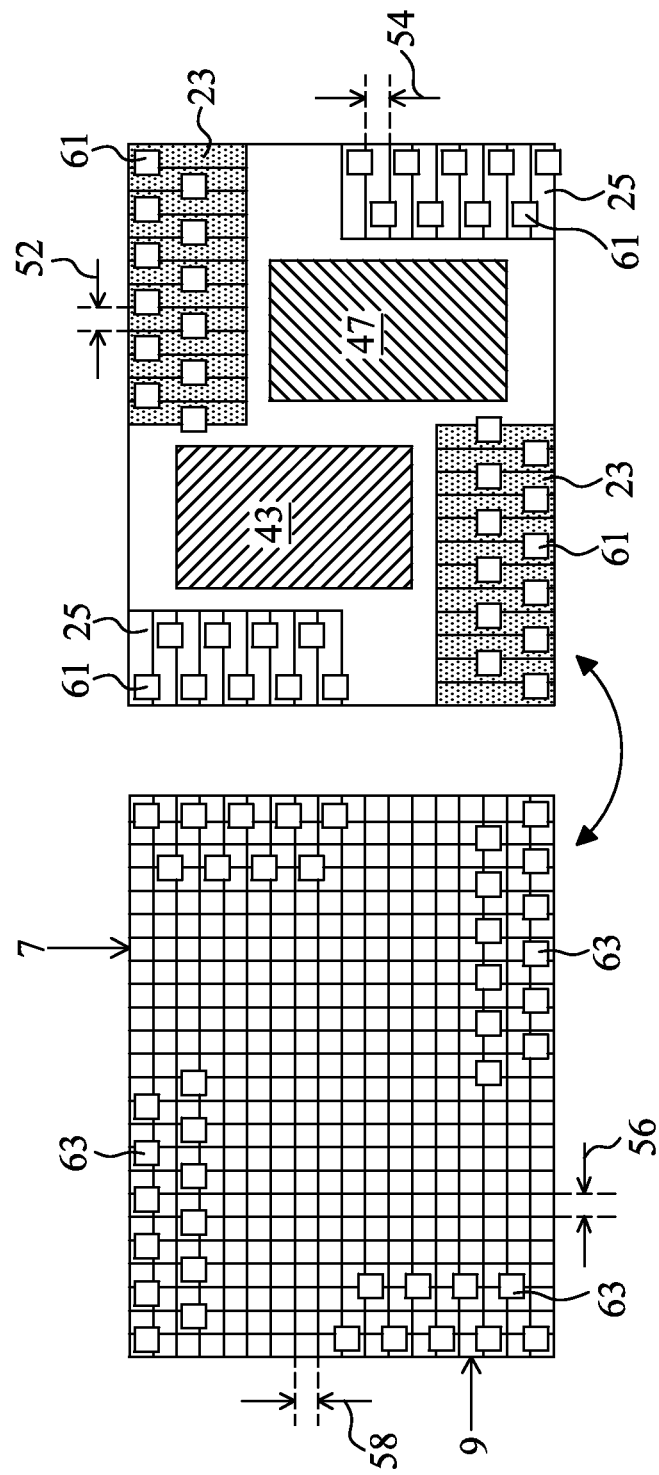
FIG. 4 is a plan view showing an arrangement of features of yet another embodiment of upper and lower chips of a 3D image sensor according to the disclosure.

As the pixel width decreases it becomes more difficult to have the inter-chip bonding pads wholly contained within the corresponding row/column of pixels and within the pixel-matched column circuit regions 23 and row circuit regions 25. FIG. 4 shows another embodiment with many similar features to the embodiment illustrated in FIG. 3. One difference between the embodiments shown in FIGS. 3 and 4 is that FIG. 4 includes staggered inter-chip bonding pads 61 that are wider than widths 52 and 54. Inter-chip bonding pads 61 of lower chip 3 correspond to inter-chip bonding pads 63 on upper chip 1 which are the same dimension. The staggered arrangement of inter-chip bonding pads 61 on lower chip 3 is exemplary only and they are arranged in various other configurations in other embodiments. When the width of inter-chip bonding pads 61 are greater than, the same as, or close to the corresponding widths 52, 54 of the corresponding column circuit region 23 and row circuit region 25, the staggered arrangement shown in FIG. 4 is advantageously used. In one embodiment in which widths 52 and 58 are about 1.1 microns, the inter-chip bonding pad would require a width no greater than 0.5 microns in order to be disposed adjacent one another such as shown in FIG. 3. If the inter-chip bonding pads have a width greater than 0.5 microns in this embodiment, a staggered arrangement such as illustrated in FIG. 4 is advantageously utilized. These numerical values are intended to be exemplary only and in other embodiments, various other numerical values dictate the placement of the inter-chip bonding pads. Various other restrictions against locating the inter-chip bonding pads adjacent one another, result in various staggered arrangements such as the arrangement shown in FIG. 4.

Figure 5:
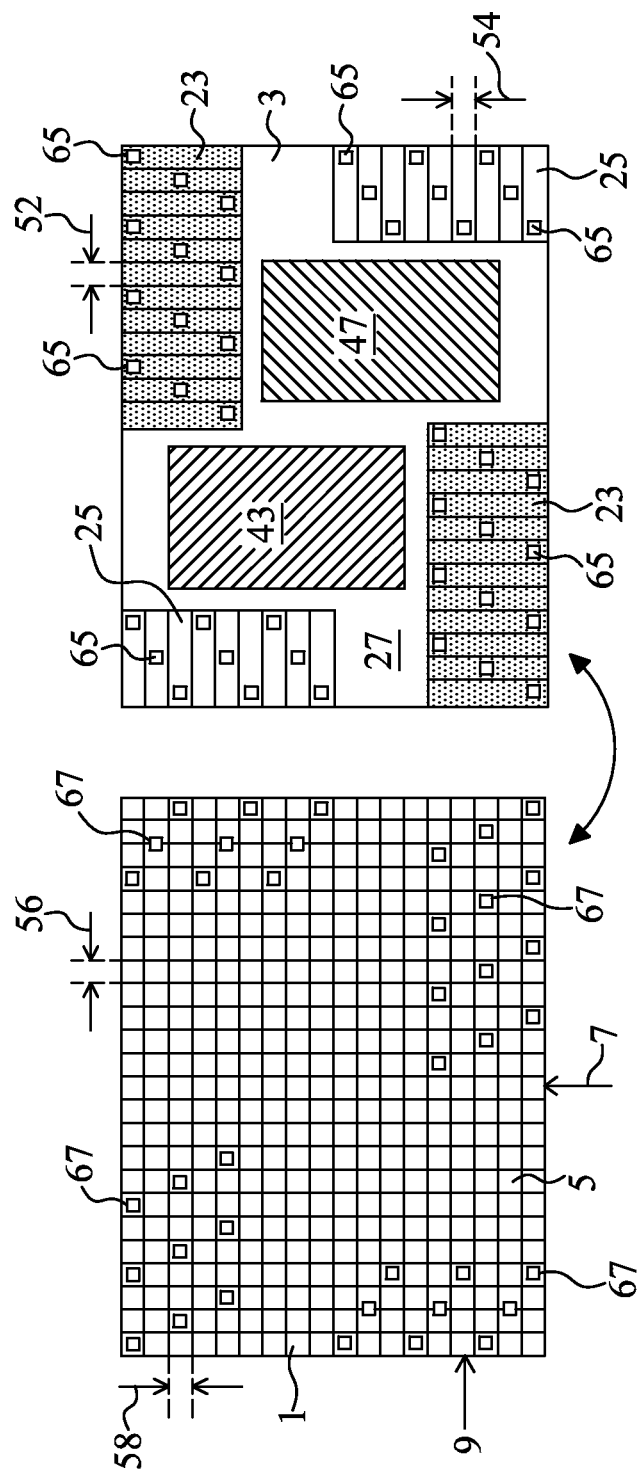
FIG. 5 is a plan view showing an arrangement of features of still another embodiment of upper and lower chips of a 3D image sensor according to the disclosure.

FIG. 5 shows another exemplary embodiment in which inter-chip bonding pads 65 are present in another staggered arrangement even though inter-chip bonding pads 65 are dimensioned to be smaller than widths 52, 54 of corresponding column circuit regions 23 and row circuit regions 25, respectively. Various design rules may also warrant positioning the inter-chip bonding pads 65 in a staggered arrangement.

Figure 6:
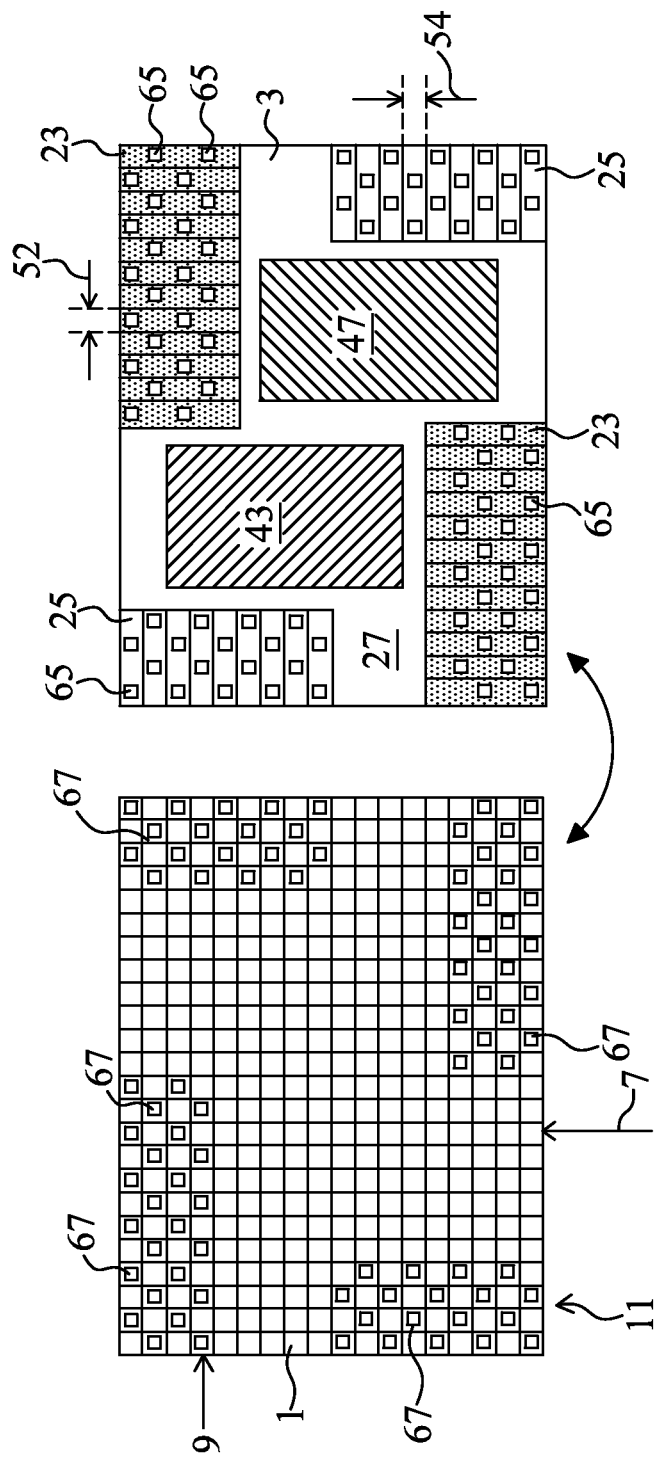
FIG. 6 is a plan view showing an arrangement of features of a further embodiment of upper and lower chips of a 3D image sensor according to the disclosure.

In FIG. 6, inter-chip bonding pads 65 include a width smaller than widths 52, 54 of column circuit regions 23 and row circuit regions 25, respectively. In each column circuit region 23 and in each row circuit region 25 there are two inter-chip bonding pads 65 and these two inter-chip bonding pads 65 correspond to two inter-chip bonding pads 67 on the associated row or column of pixel array 11. In one embodiment of the illustrated arrangement of FIG. 6, each column 7 and each row 9 includes two signal lines, each associated with a corresponding inter-chip bonding pad 67.

Figure 7:
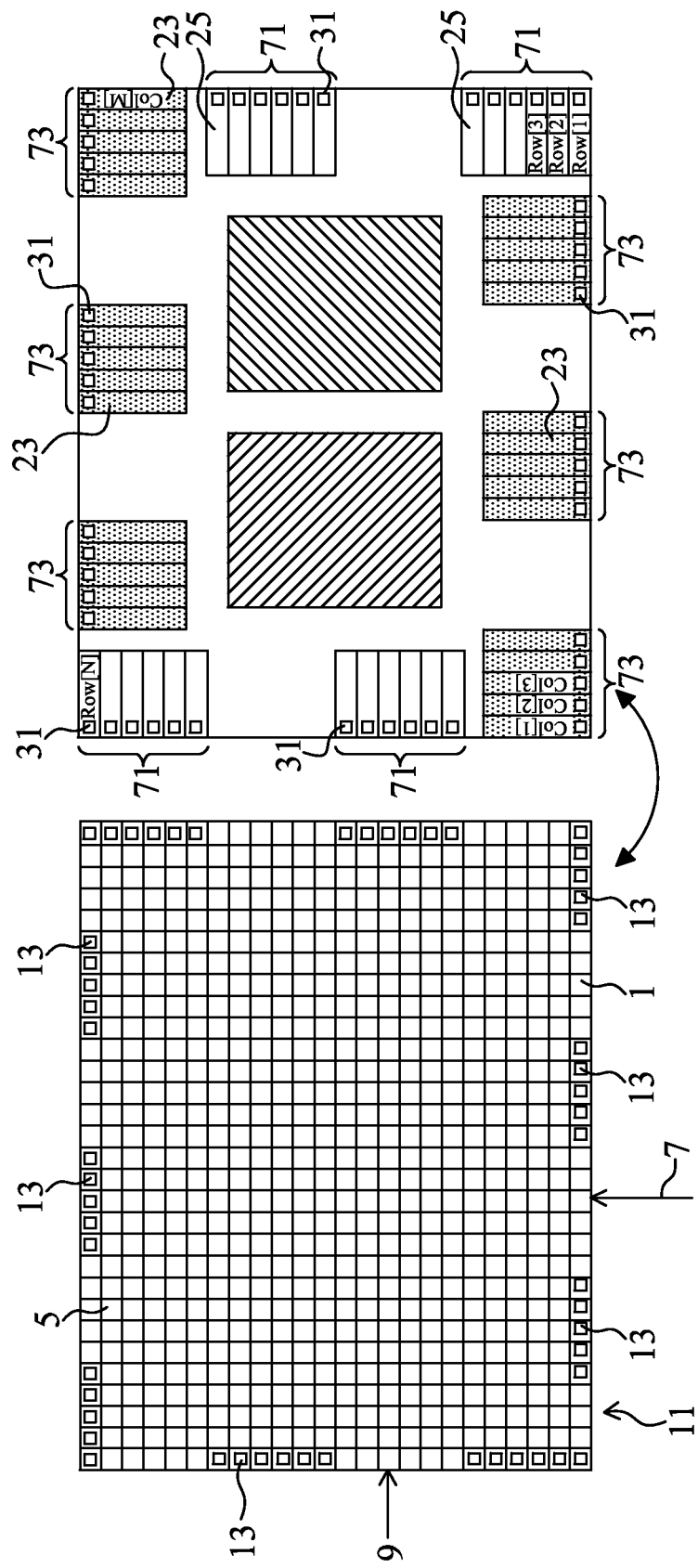
FIG. 7 is a plan view showing an arrangement of features of a further embodiment of upper and lower chips of a 3D image sensor according to the disclosure.

FIG. 7 shows another exemplary arrangement in which the column circuit regions 23 and also in which the row circuit regions 25 are divided into more than two groups. Upper chip 1 includes pixels 5 arranged in columns 7 and rows 9 and each column 7 and row 9 includes an associated inter-chip bonding pad 13. Each inter-chip bonding pad 13 corresponds to an inter-chip bonding pad 31 of lower chip 3. Each row 9 of pixel array 11 has one corresponding row circuit region 25 and each column 7 has one corresponding column circuit region 23 and vice versa. Each column circuit region 23 and each row circuit region 25 includes one inter-chip bonding pad 31. FIG. 7 illustrates an embodiment in which each row circuit region 25 is coupled to a corresponding row 9 through a single set of inter-chip bonding pads 13, 31 and also in which each column circuit region 23 is coupled to a corresponding column 7 through a single set of inter-chip bonding pads 13, 31. In the embodiment of FIG. 7, the row circuit regions 25 grouped into four groups 71. Column circuit regions 23 are grouped into six groups 73. Additional circuitry is included in regions 43 and 47. The additional circuitry 43, 47 includes various control circuits, timing generators, and other peripheral circuits such as bias generators, reference generators that generate reference voltages, low-dropout regulators, global amplifiers and ADC's, control circuits that generate sensor timing-control signals, phase-locked loop clock generators and so forth, in various embodiments, and are coupled to various other components using connections that are not shown in FIG. 7.

Figure 8:
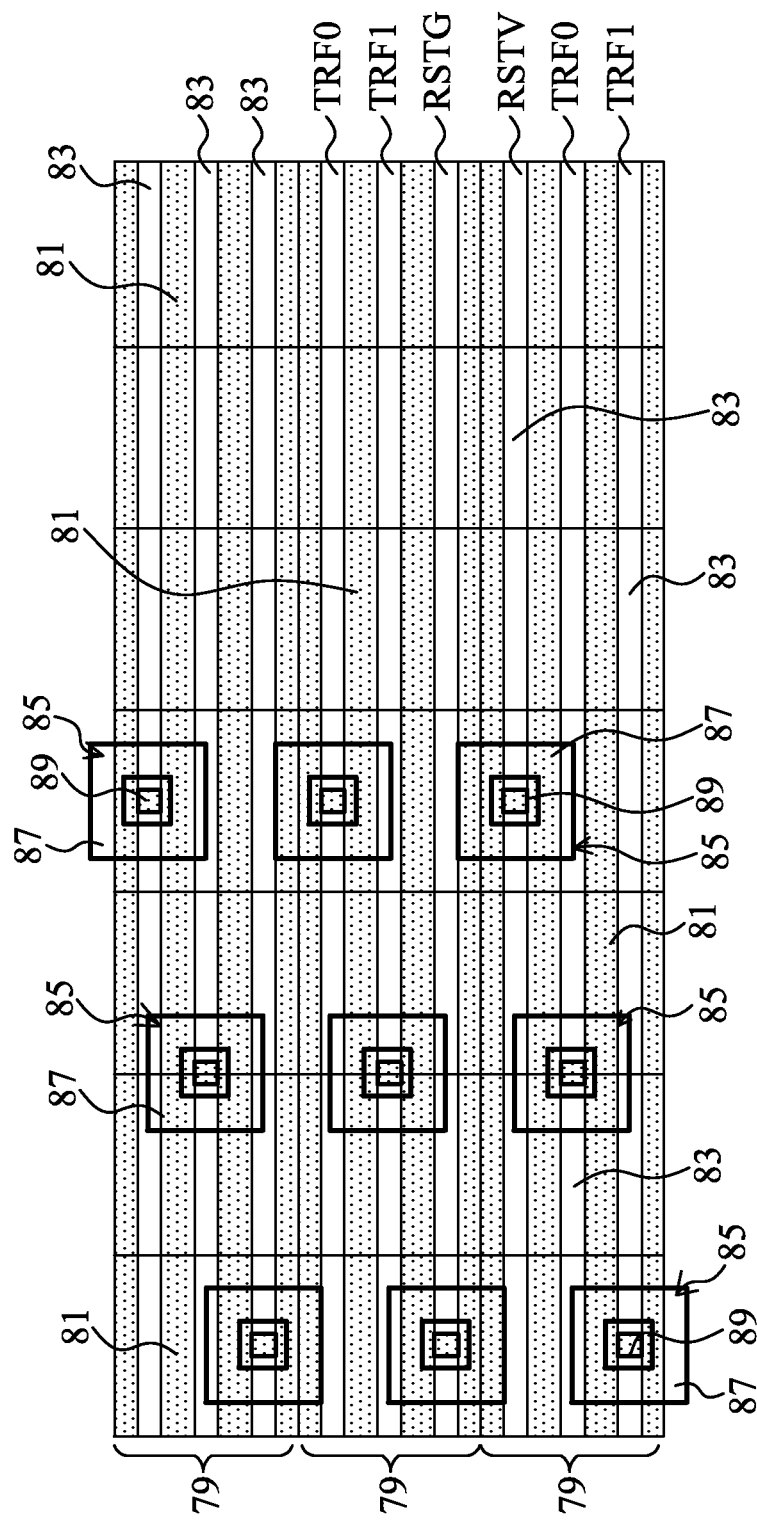
FIG. 8 is a plan view showing an arrangement of contacts disposed along pixel rows that include three signal lines, according to an embodiment of the disclosure.

FIG. 8 is a top view illustrating an embodiment in which each row 79 of pixels 81 includes three control signal lines 83. Each signal line 83 is coupled to an associated inter-chip bonding pad 85. Each inter-chip bonding pad 85 includes at least an upper metal bonding layer 87 and via 89. In the illustrated embodiment, the inter-chip bonding pads 85 within a pixel row 79 are staggered with respect to one another. Further, inter-chip bonding pads 85 disposed in adjacent pixel rows 79 are situated in the same location along the y-axis in the illustrated embodiment but other arrangements are used in other embodiments.

Figure 9:
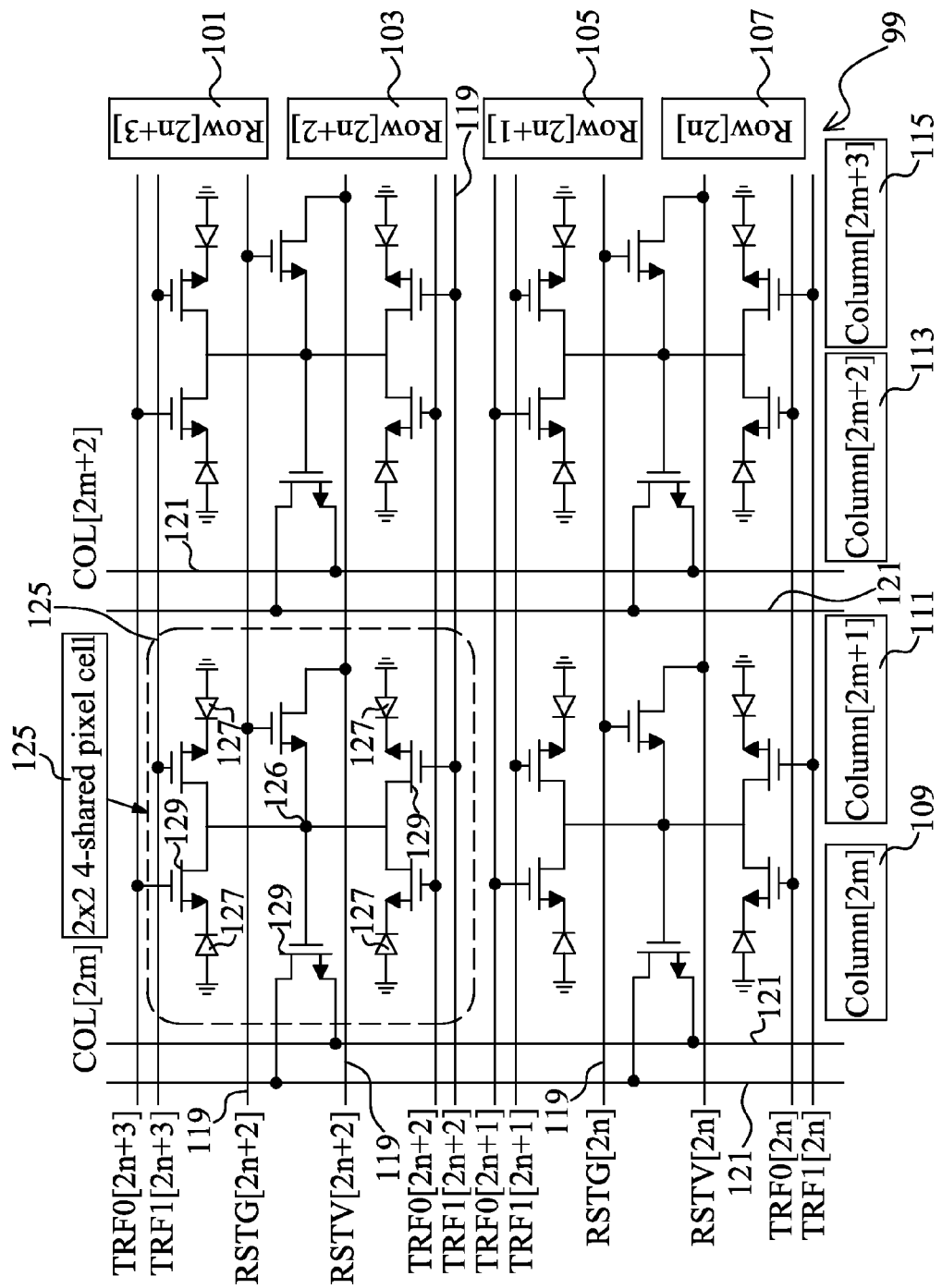
FIG. 9 is a wiring diagram of an exemplary 2×2 4-shared pixel cell of a pixel array and electrical couplings according to an embodiment of the disclosure.

Now referring to both FIGS. 8 and 9, FIG. 9 shows an arrangement of an exemplary 2×2, 4-shared pixel cell that does not include row-select transistors. The circuit diagram of FIG. 9 shows illustrated portion 99 of a pixel array and includes portions of four rows, row 101, row 103, row 105, and row 107 as well as portions of four columns, column 109, column 111, column 113, and column 115. In this illustrated embodiment, pixel cell 125 is a 2×2, 4-shared pixel cell and each pixel includes an associated photodiode 127 as well as various pixel cell transistors 129. The pixel cell transistors 129 share the same charge-sensing node 126. Each row includes three row control signal lines 119 and each column includes two column signal lines 121. According to one embodiment, the row control signal lines 119 in two adjacent rows 101 and 103 include two NMOS transfer-gate signal lines TRF0 and TRF1, one reset-gate signal line RSTG and one reset-drain signal line RSTV and these row signal lines 119 of FIG. 8 correspond to signal lines 83 identified as signal lines TRF0, TRF1, RSTG and RSTV of FIG. 8. The two column signal lines 121 are the column bus and the column supply voltage in the illustrated embodiment.

Various other arrangements for placing multiple inter-chip bonding pads 85 in a row or column of pixel arrays, are used in other embodiments, including other n×n pixel cell arrangements in other embodiments of the disclosure.

Figure 10:
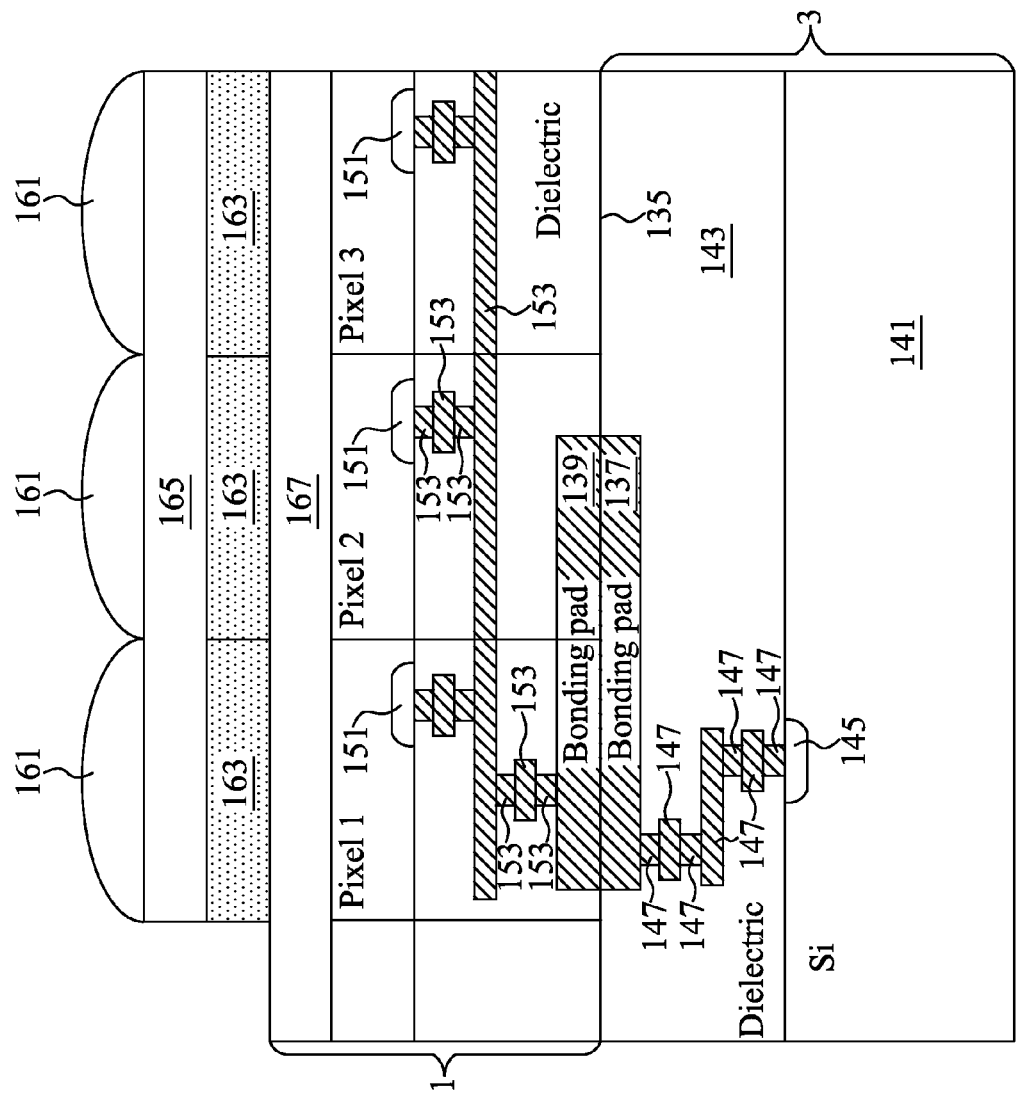
FIG. 10 is a cross-sectional view of a portion of a lower chip bonded to an upper chip that includes a pixel array, micro lenses and color filters according to an embodiment of the disclosure.

FIG. 10 is a cross-sectional view showing upper chip 1 bonded to lower chip 3 at wafer bonding interface 135. At wafer bonding interface 135, inter-chip bonding pad 137 of lower chip 3 is bonded to corresponding inter-chip bonding pad 139 of upper chip 1 to electrically couple the chips 1, 3 together. Various means for mounting upper-chip 1 on lower chip 3 were described previously and are used to bond the two chips together either in chip-to-chip fashion, wafer-to-wafer fashion or chip-to-wafer fashion. In one embodiment, lower chip 3 includes semiconductor portion 141 with dielectric 143 disposed thereover and inter-chip bonding pad 137 is coupled to feature 145 of a row circuit formed in lower chip 3, through metal interconnects 147. The pixel array of upper chip 1 includes labeled "pixel 1", "pixel 2" and "pixel 3" adjacent one another such as formed along a corresponding row of a pixel array formed in upper chip 1. Photodiode contacts 151 are coupled to inter-chip bonding pad 139 through metal interconnect structures 153 and column bus line 155 formed in dielectric 157. According to the embodiment illustrated in FIG. 10, each pixel has an associated microlens 161 and color filters 163 separated by planarization layer 165 and transparent dielectric 167.

In one embodiment, a 3D image sensor is provided. The 3D image sensor comprises: an upper chip with a pixel array thereon and a lower chip with column circuits, row circuits and other non-pitch-matched analog-digital signal processing circuits thereon The column circuits are each disposed in a corresponding rectangular column circuit region on the lower chip and each corresponds to a column of the pixel array and the row circuits are each disposed in a corresponding rectangular row circuit region in the lower chip and each corresponds to a row of the pixel array. The rectangular row circuit regions are arranged parallel to one another and orthogonal to the rectangular column circuit regions. The upper chip is stacked over and electrically coupled to the lower chip.

In another embodiment, a method for forming a 3D image sensor is provided. The method comprises: providing an upper substrate and forming a pixel array on an upper chip thereof; providing a lower substrate and forming column circuits and row circuits on a lower chip thereof, including forming the column circuits in corresponding rectangular column circuit regions that each correspond to a column of the pixel array and forming the row circuits in corresponding rectangular row circuit regions that each correspond to a row of the pixel array, wherein the rectangular row circuit regions are arranged parallel to one another and orthogonal to the rectangular column circuit regions. The method also comprises mounting the upper chip on the lower chip and bonding the upper chip to the lower chip.

In another embodiment, a 3D image sensor is provided. The 3D image sensor comprises: an upper chip with a pixel array thereon, each row of pixels of the pixel array including a plurality of signal lines; a lower chip with column circuits and row circuits thereon; the column circuits each disposed in a corresponding rectangular column circuit region on the lower chip and each corresponding to a column of the pixel array and having a width substantially equal to a width of the column of the pixel array. The row circuits are each disposed in a corresponding rectangular row circuit region on the lower chip and each correspond to a row of the pixel array and include a corresponding plurality of contacts coupled to the plurality of signal lines. The rectangular row circuit regions are arranged parallel to one another and orthogonal to the rectangular column circuit regions. The upper chip is stacked over and electrically coupled to the lower chip. The rectangular column circuit regions are separated into a plurality of different column circuit groups, each column circuit group including a plurality of the rectangular column circuit regions arranged adjacent one another, and the rectangular row circuit regions are separated into a plurality of row circuit groups, each row circuit group including a plurality of the rectangular row circuit regions arranged adjacent one another.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A 3D image sensor comprising:
a first chip with a pixel array thereon;

a second chip with column circuits and row circuits thereon;

said column circuits each disposed in a corresponding column circuit region on said second chip and each corresponding to a column of said pixel array;

said row circuits each disposed in a corresponding row circuit region in said second chip and each corresponding to a row of said pixel array, wherein each said row circuit region is rectangular and has a width substantially equal to a width of a row of pixels of said pixel array;

said row circuit regions arranged parallel to one another and orthogonal to said column circuit regions, and wherein said first chip is stacked over and electrically coupled to said second chip and;

wherein said first chip comprises a single oxide NMOS chip and said second chip comprises a dual oxide CMOS chip.

2. The 3D image sensor as in claim 1, wherein said first chip does not include said column circuits and said row circuits thereon and said first chip is mounted on and directly bonded to said second chip.

3. The 3D image sensor as in claim 1, wherein said column circuits comprise output data collection circuits.

4. The 3D image sensor as in claim 1, wherein said row circuits comprise control circuits.

5. The 3D image sensor as in claim 3, wherein said output data collection circuits are configured to convert signals to digital signals and wherein said row circuits comprise control circuits.

6. The 3D image sensor as in claim 4, wherein said control circuits comprise routing reset, decoder, and shift register components and wherein said column circuits comprise at least one of a current source to drive a pixel source-follower, analog switches and multiplexing circuits, an amplifier and a column-parallel ADC (analog to digital converter).

7. A 3D image sensor comprising:
a first chip with a pixel array thereon;
a second chip with column circuits and row circuits thereon;
said column circuits each disposed in a corresponding column circuit region on said second chip and each corresponding to a column of said pixel array;
said row circuits each disposed in a corresponding row circuit region in said second chip and each corresponding to a row of said pixel array;
said row circuit regions arranged parallel to one another and orthogonal to said column circuit regions, and
wherein said first chip is stacked over and electrically coupled to said second chip,
wherein each said column circuit region is rectangular and has a width substantially equal to a width of a column of pixels of said pixel array and wherein said first chip comprises a single oxide NMOS chip and said second chip comprises a dual oxide CMOS chip.

8. The 3D image sensor as in claim 1, wherein said row circuit regions are separated into a plurality of different groups, each said group including a plurality of said rectangular row circuit regions arranged adjacent one another.

9. The 3D image sensor as in claim 1, wherein said column circuit regions are rectangular and are separated into a plurality of different groups, each said group including a plurality of said rectangular column circuit regions arranged adjacent one another.

10. The 3D image sensor as in claim 1, wherein said second chip further comprises one inter-chip bonding pad associated with each said column circuit and coupled to a corresponding column of pixels of said pixel array.

11. The 3D image sensor as in claim 1, wherein said second chip further comprises at least one staggered inter-chip bonding pad associated with each said column circuit region and having a width greater than a width of said corresponding column circuit region and coupled to a single line of a corresponding column of pixels of said pixel array.

12. The 3D image sensor as in claim 1, wherein each row of pixels of said pixel array includes a plurality of signal lines and said second chip includes a corresponding plurality of inter-chip bonding pads associated with each said row circuit region and coupled to said plurality of signal lines.

13. The 3D image sensor as in claim 1, wherein each column of pixels of said pixel array includes a plurality of signal lines and each said rectangular column circuit region is associated with a corresponding plurality of inter-chip bonding pads on said second chip and coupled to said plurality of signal lines.

14. The 3D image sensor as in claim 1, wherein said first chip comprises a single oxide NMOS chip and said second chip comprises a dual oxide CMOS chip.

15. The 3D image sensor as in claim 12, wherein pixels of said pixel array are arranged in pixel cells of n×n pixels that share a common node.

16. A method for forming a 3D image sensor, said method comprising:
providing a first substrate and forming a pixel array on a first chip thereof;
providing a second substrate and forming column circuits and row circuits on a second chip thereof, including forming said column circuits in corresponding rectangular column circuit regions that each correspond to a column of said pixel array and forming said row circuits in corresponding rectangular row circuit regions that each correspond to a row of said pixel array, wherein said column circuits comprise output data collection circuits, said row circuits comprise control circuits, wherein each said rectangular column circuit region has a width substantially equal to a width of a column of pixels of said pixel array, each said rectangular row circuit region has a width substantially equal to a width of a row of pixels of said pixel array and each row of pixels of said pixel array includes a plurality of lines, wherein
said bonding comprising bonding each said row circuit to an associated one of said signal lines of said corresponding row of pixels using a corresponding plurality of inter-chip bonding pads; said rectangular row circuit regions are arranged parallel to one another and orthogonal to said rectangular column circuit regions; and
mounting said first chip on said second chip and bonding said first chip to said second chip.

17. The method as in claim 16, wherein said forming a pixel array comprises using NMOS processing and wherein said forming said column circuits and row circuits comprises using CMOS processing.

18. The method as in claim 16, wherein said column circuits comprise output data collection circuits, said row circuits comprise control circuits, each said rectangular row circuit region has a width substantially equal to a width of a row of pixels of said pixel array and each row of pixels of said pixel array includes a plurality of signal lines, and
wherein said bonding comprising bonding each said row circuit to an associated one of said signal lines of said corresponding row of pixels using a corresponding plurality of inter-chip bonding pads.

19. The method as in claim 16, wherein said column circuit regions are grouped into at least three column circuit groups, each having a plurality of column circuit regions adjacent one another, and said row circuit regions are grouped into at least three row circuit groups, each having a plurality of row circuit regions adjacent one another.

20. The method as in claim 16, wherein said providing a first substrate further comprises forming a plurality of further first chips on said first substrate, said providing a second substrate further comprises forming a plurality of said second chips on said second substrate and wherein said mounting comprises mounting said first chip and said plurality of first chips of said first substrate, on said second chip and said plurality of said second chips of said second substrate.

21. A 3D image sensor comprising:
   a first chip with a pixel array thereon, each row of pixels of said pixel array including a plurality of signal lines;
   a second chip with column circuits and row circuits thereon;
   said column circuits each disposed in a corresponding rectangular column circuit region on said second chip and each corresponding to a column of said pixel array and having a width substantially equal to a width of said column of said pixel array;
   wherein said column circuits comprise output data collection circuits,
   said row circuits each disposed in a corresponding rectangular row circuit region on said second chip and each corresponding to a row of said pixel array and including a corresponding plurality of contacts coupled to said plurality of signal lines;
   said row circuits comprise control circuits, each said rectangular row circuit region has a width substantially equal to a width of a row of pixels of said pixel array and each row of pixels of said pixel array includes a plurality of lines,
   said rectangular row circuit regions arranged parallel to one another and orthogonal to said rectangular column circuit regions, and
   wherein said first chip is stacked over and electrically coupled to said second chip, said rectangular column circuit regions are separated into a plurality of different column circuit groups, each said column circuit group including a plurality of said rectangular column circuit regions arranged adjacent one another, and said rectangular row circuit regions are separated into a plurality of row circuit groups, each said row circuit group including a plurality of said rectangular row circuit regions arranged adjacent one another,
   wherein said column circuit regions are each disposed under a corresponding column of said pixel array and said row circuit regions are each disposed under a corresponding row of said pixel array
   mounting said first chip on said second chip and bonding said first chip to said second chip, wherein
   said bonding comprising bonding each said row circuit to an associated one of said signal lines of said corresponding row of pixels using a corresponding plurality of inter-chip bonding pads.

* * * * *